US 9,896,046 B2

(12) United States Patent
Momeni et al.

(10) Patent No.: US 9,896,046 B2
(45) Date of Patent: Feb. 20, 2018

(54) RECEIVING ARRANGEMENT FOR A CONTROL DEVICE IN A VEHICLE, AND METHOD FOR GENERATING A SYNCHRONIZATION PULSE

(71) Applicant: Robert Bosch GmbH, Stuttgart (DE)

(72) Inventors: Massoud Momeni, Filderstadt (DE); Matthias Siemss, Gomaringen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 216 days.

(21) Appl. No.: 14/654,230

(22) PCT Filed: Dec. 9, 2013

(86) PCT No.: PCT/EP2013/075948
§ 371 (c)(1),
(2) Date: Jun. 19, 2015

(87) PCT Pub. No.: WO2014/102053
PCT Pub. Date: Jul. 3, 2014

(65) Prior Publication Data
US 2015/0321629 A1 Nov. 12, 2015

(30) Foreign Application Priority Data

Dec. 27, 2012 (DE) .......................... 10 2012 224 390

(51) Int. Cl.
*H03K 4/94* (2006.01)
*B60R 16/03* (2006.01)
(Continued)

(52) U.S. Cl.
CPC ............ *B60R 16/03* (2013.01); *B60R 16/023* (2013.01); *H03K 4/94* (2013.01); *H04L 7/044* (2013.01);
(Continued)

(58) Field of Classification Search
CPC ........ B60R 16/03; B60R 16/023; H03K 4/94; H04L 7/044; H04L 12/40006; H04L 7/0091
(Continued)

(56) References Cited

U.S. PATENT DOCUMENTS 5,408,497 A    4/1995  Baumann et al.
7,421,321 B2 *  9/2008  Breed ..................... B60C 11/24
                                            340/442
(Continued)

FOREIGN PATENT DOCUMENTS

DE    10 2008 041 030    2/2010
DE    10 2009 001 370    9/2010
(Continued)

OTHER PUBLICATIONS

"PS15 Peripheral Sensor Interface Specification V1.3", Jul. 29, 2008, pp. 1-46, XP055028023.
(Continued)

*Primary Examiner* — Dinh T Le
(74) *Attorney, Agent, or Firm* — Norton Rose Fulbright US LLP; Gerard Messina

(57) ABSTRACT

A receiving assemblage is provided for a control device in a vehicle, having a voltage generator for generating a synchronization pulse, which encompasses a first voltage source, a current source, and a current sink, the voltage generator generating the synchronization pulse within predefined specification limits with a predefined shape and a predefined time-related behavior, and the receiving assemblage outputting the synchronization pulse via a data bus to at least one sensor for synchronization of a subsequent signal transfer, the voltage generator generating the synchronization pulse via the current source and the current sink, substantially as a sinusoidal oscillation, by charging and/or
(Continued)

discharging a bus load, and to a method for generating a synchronization pulse.

8 Claims, 3 Drawing Sheets

(51) Int. Cl.
    *B60R 16/023*     (2006.01)
    *H04L 7/04*     (2006.01)
    *H04L 7/06*     (2006.01)
    *H04L 12/40*     (2006.01)
    *H04L 7/00*     (2006.01)

(52) U.S. Cl.
    CPC .......... *H04L 7/06* (2013.01); *H04L 12/40006* (2013.01); *H04L 7/0091* (2013.01)

(58) Field of Classification Search
    USPC .............................................. 307/9; 327/130
    See application file for complete search history.

(56) References Cited

U.S. PATENT DOCUMENTS

| | | | |
|---|---|---|---|
| 9,619,425 B2* | 4/2017 | Momeni | ................. B60T 7/042 |
| 2006/0152258 A1 | 7/2006 | Kojima | |
| 2015/0151701 A1* | 6/2015 | Weiss | ........................ H04L 7/04 |
| | | | 307/9.1 |

FOREIGN PATENT DOCUMENTS

| | | |
|---|---|---|
| EP | 1 435 712 | 7/2004 |
| WO | WO 2008/056208 | 5/2008 |

OTHER PUBLICATIONS

International Search Report for PCT/EP2013/075948, dated Mar. 17, 2014.

* cited by examiner

RECEIVING ARRANGEMENT FOR A CONTROL DEVICE IN A VEHICLE, AND METHOD FOR GENERATING A SYNCHRONIZATION PULSE

FIELD OF THE INVENTION

The present invention proceeds from a receiving assemblage for a control device in a vehicle, and from an associated method for generating a synchronization pulse.

BACKGROUND INFORMATION

Peripheral sensors for occupant protection systems usually use current interfaces (e.g. PAS4, PSI5) to transfer sensor data to a central control device (ECU) in a vehicle. In current interfaces of the latest generation (PSI5), bus operation with multiple sensors on one receiver is made possible by synchronization. For the synchronization function, a working clock signal in the form of a voltage pulse is generated by the central control device (ECU); said pulse is detected by the sensors on the bus and characterizes the beginning of a new cycle for data transfer. This voltage pulse is referred to as a "synchronization pulse" and is produced with the aid of current sources and current sinks that respectively charge and discharge the bus load. This voltage pulse is typically repeated every 500 μs.

In order for a synchronous bus system to function with one sensor or with multiple sensors, it is important that the synchronization pulse have a specific shape and exhibit a specific time-related behavior for all possible bus configurations and under all possible operating conditions. A trapezoidal synchronization pulse having a predefined edge slope is therefore used as a rule in known synchronous bus systems. The edge slope here is between an edge slope of a first characteristic curve which represents a lower limit, and an edge slope of a second characteristic curve which represents an upper limit. During synchronous bus operation, the trapezoidal shape of the synchronization pulse results in increased electromagnetic emission (EMC) in the signal transfer frequency spectrum because of the large proportion of harmonics. This can be counteracted to a certain degree, for example, by way of a synchronization pulse that has a trapezoidal shape having four rounded corners.

The unexamined German application DE 10 2009 001 370 A1 describes a receiving device for accepting current signals, a circuit assemblage having such a receiving device, and a method for transferring current signals via a bus system. The receiving device described encompasses at least two bus connector devices for the acceptance of current signals of multiple transmitters, each bus connector device being embodied for connection to at least one respective bus connection, and a control device for outputting synchronization pulses to the bus connector devices for synchronization of the transmitters. The bus connector devices output the synchronization pulses to the multiple transmitters with at least one time offset with respect to one another, the synchronization pulses each having a trapezoidal shape having rounded corners.

SUMMARY

The receiving assemblage according to the present invention for a control device in a vehicle, and the method according to the present invention for generating a synchronization pulse, have the advantage, in contrast thereto, that correct acquisition of the quiescent current by the current sources of the synchronization pulse generator at the start of the synchronization pulse is ensured.

An indication of the magnitude of the quiescent current is present thanks to automatic regulation of the quiescent current in the residual receiver circuit, which is present-day existing art. This information can be used by the voltage generator to generate the synchronization pulse, in order to correctly acquire the quiescent current with the charging or discharging current sources. Inaccuracies can occur in the context of this acquisition, since the circuit for sensing the quiescent current is independent of the circuit for generating the synchronization pulse.

The essence of the invention is the minimization of inaccuracies in the acquisition of the quiescent current from the voltage supply of the receiver by the charging and discharging current sources in order to generate the synchronization pulse. In addition, embodiments of the present invention assist compliance with limits in accordance with the present PSI5 specification.

Because the voltage generator for generating the synchronization pulse and the circuit for sensing the quiescent current in the residual receiver circuit are independent of one another, the current sensed by the quiescent current regulator can differ from the current applied as control by the synchronization pulse generator. For example, if the charging current from the voltage generator is greater than the quiescent current of the residual receiver circuit, this can result in a positive voltage offset or a positive voltage difference at the end of the synchronization pulse. If the charging current from the voltage generator is less than the quiescent current, this can result in a negative voltage offset or a negative voltage difference at the end of the synchronization pulse.

Embodiments of the present invention begin the synchronization pulse with a voltage that corresponds approximately to the value of a quiescent voltage of the supply voltage of the second voltage source, and that as a rule exhibits no appreciable voltage difference or no appreciable voltage offset. The reason for this is that the bus capacitance integrates the current on the bus, and represents brief dips or rises in the current in smoothed fashion in the voltage. The voltage difference is therefore most clearly detectable at the end of the synchronization pulse. The pulse voltage of the synchronization pulse that is generated is therefore monitored toward the end of the synchronization pulse and is continuously compared with the supply voltage, generated by the second voltage source, for the receiver. If the pulse voltage differs from the supply voltage, control application to the current source and to the current sink is then correspondingly adapted.

The lowest possible electromagnetic emission, in particular in the signal transfer spectral region (100 kHz to 300 kHz), can furthermore be achieved thanks to the sinusoidal embodiment of the synchronization pulse within the predefined limits.

Embodiments of the present invention make available a receiving assemblage for a control device in a vehicle which has a voltage generator, for generating a synchronization pulse, that encompasses a first voltage source, a current source, and a current sink. The voltage generator generates the synchronization pulse within predefined specification limits with a predefined shape and a predefined time-related behavior, and the receiving assemblage outputs the synchronization pulse via a data bus to at least one sensor for synchronization of a subsequent signal transfer. The voltage generator generates the synchronization pulse via the current source and the current sink, substantially as a sinusoidal oscillation, by charging and/or discharging a bus load.

According to the present invention the voltage generator compares a voltage value at the end of the synchronization pulse with a corresponding voltage value of a supply voltage of a second voltage source of the residual receiver circuit, and ascertains a voltage difference. The voltage generator applies control to the current source and to the current sink as a function of the ascertained voltage difference in such a way that the ascertained voltage difference drops below a predefined threshold value. Preferably an attempt is made to regulate the voltage difference to 0 V. The current source can, for example, furnish current values that are greater than or equal to 0 mA, and the current sink can, for example, furnish current values that are less than 0 mA.

A method for generating a synchronization pulse for synchronizing a subsequent signal transfer between a receiving assemblage and at least one sensor via a data bus in a vehicle is furthermore proposed. The synchronization pulse is generated within predefined specification limits with a predefined shape and a predefined time-related behavior, and is transferred from the receiver assemblage to the at least one sensor at the beginning of the signal transfer between the at least one sensor and the receiver assemblage, the synchronization pulse being generated substantially as a sinusoidal oscillation. According to the present invention, a voltage value at the end of the synchronization pulse is compared with a corresponding voltage value of a supply voltage of a second voltage source of the residual receiver circuit, and a voltage difference is ascertained. Control is applied to the current source and to the current sink as a function of the ascertained voltage difference in such a way that the ascertained voltage difference drops below a predefined threshold value. Preferably an attempt is made to regulate the voltage difference to 0 V.

It is particularly advantageous that the voltage generator encompasses at least one digital control application circuit and at least one digital/analog converter, which generate a substantially sinusoidal reference current and output it to the current source and to the current sink. For example, a first digital control application circuit and a first digital/analog converter can generate a substantially sinusoidal reference current and output it to the current source. A second digital control application circuit and a second digital/analog converter can likewise generate a substantially sinusoidal reference current and output it to the current sink. This advantageously makes possible a very robust implementation of the synchronization pulse, and reduced electromagnetic emission. In addition, the application of control to the synchronization pulse can be displaced entirely into the digital section of the circuit, which can result in an area-efficient solution given the constant scaling progress of semiconductor technology. Voltage supply to the receiver can be decoupled from the data bus during the synchronization pulse, while the voltage generator for generating the synchronization pulse is activated. Because the voltage generator for generating the synchronization pulse encompasses a current source and a current sink, the need for an additional switch in series with the current source and the current sink can be eliminated. Alternatively, a shared digital control application circuit and a shared digital/analog converter can generate a substantially sinusoidal reference current and output it to the current source and to the current sink. Shared utilization of the digital control application circuit and of the digital/analog converter can reduce the number of components in the voltage generator and economize on layout area.

The shape of the synchronization pulse either can be stored in the digital section or in the digital control application circuit, or can be calculated with the aid of an algorithm. The digital/analog converter generates, from an N-bit data word, a reference current that is conveyed via the current source or current sink onto the data bus and respectively charges or discharges the load present on the data bus. In order to generate a substantially sinusoidal synchronization pulse, i.e. a sinusoidal or approximately sinusoidal synchronization pulse, sinusoidal or approximately sinusoidal control is applied both to the current source and to the current sink. For emissions reasons, the resolution of the data word can be selected in such a way that the synchronization pulse can be mapped without significant discontinuities. The capacitance of the bus load integrates the bus current and thereby smooths the voltage on the data bus.

In a further advantageous embodiment of the receiving assemblage according to the present invention, the at least one digital control application circuit can regulate the synchronization pulse based on the quiescent current and on the bus load. A quiescent current regulator of the residual receiver circuit preferably supplies an indication of the quiescent current. A synchronization pulse amplitude that has been reached can furthermore supply an indication of the bus load. The synchronization pulse amplitude can be ascertained by an evaluation of the bus voltage. The information regarding the synchronization pulse amplitude that has been reached is obtained via the evaluation of the bus voltage. For evaluation of the bus voltage, for example, a decision threshold is defined and is monitored within a defined time window, for example by a comparator. The at least one digital control application circuit detects an excessively high synchronization pulse amplitude if the synchronization pulse reaches the decision threshold at a point in time that is located before the time window. The at least one digital control application circuit detects an excessively low synchronization pulse amplitude if the synchronization pulse does not reach the decision threshold during a period length of the synchronization pulse. The at least one digital control application circuit detects a correct synchronization pulse amplitude if the synchronization pulse reaches the decision threshold at a point in time that is within the time window. In principle, the evaluation of the synchronization pulse amplitude can be carried out at any point in the synchronization pulse, for example including along the leading or trailing edge. The lowest tolerances, however, and thus the most reliable regulation, are to be expected in the vicinity of the pulse voltage maximum, since the voltage here is subject to the smallest changes. The duration of the synchronization pulse is held constant, while the step heights of the reference current outputted from the digital/analog converter can be scaled in accordance with the information from the amplitude evaluation. The step height can be calculated, for example, by multiplying the minimum possible step height by a scaling factor. The minimal step height is obtained from the minimal current from the current source or current sink. The scaling factor is increased for a synchronization pulse that is too low, and decreased for a synchronization pulse that is too high, until the correct height is achieved and the decision threshold is exceeded within the time window.

DETAILED DESCRIPTION

Figure 1:
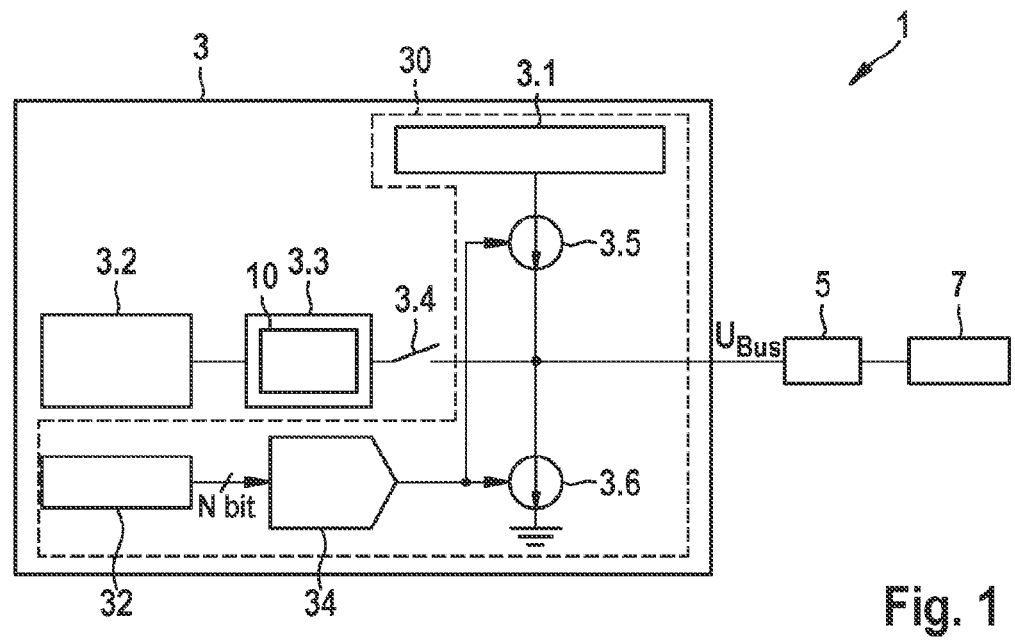
FIG. 1 is a schematic block diagram of a sensor assemblage having an exemplifying embodiment of a receiver assemblage according to the present invention for a control device in a vehicle, which assemblage generates and outputs an optimized synchronization pulse.

As is evident from FIG. 1, the exemplifying embodiment depicted of a sensor assemblage 1 encompasses a data bus 5, at least one sensor 7, and an exemplifying embodiment of a receiving assemblage 3 according to the present invention for a control device in a vehicle. Receiving assemblage 3 according to the present invention encompasses a voltage generator 30 for generating a synchronization pulse $P_{sync}$, having a first voltage source 3.1, a current source 3.5, and a current sink 3.6. Voltage generator 30 generates the synchronization pulse $P_{sync}$ by way of current source 3.5 and current sink 3.6, substantially as a sinusoidal oscillation, by charging and/or discharging a bus load. Receiving assemblage 3 outputs the synchronization pulse $P_{sync}$ via data bus 5 to the at least one sensor 7 for synchronization of a subsequent signal transfer. According to the present invention, voltage generator 30 compares a voltage value at the end 12 of the synchronization pulse $P_{sync}$ with a corresponding voltage value of a supply voltage of a second voltage source 3.2 of residual receiver circuit 3.3, and ascertains a voltage difference $U_{diff}$. Voltage generator 30 applies control to current source 3.5 and to current sink 3.6 as a function of the ascertained voltage difference $U_{diff}$ in such a way that the ascertained voltage difference $U_{diff}$ drops below a predefined threshold value. Preferably an attempt is made to regulate the voltage difference $U_{diff}$ to 0 V. In the exemplifying embodiment depicted, current source 3.5 furnishes current values that are greater than or equal to 0 mA, and current sink 3.6 furnishes current values that are less than 0 mA.

Figure 2:
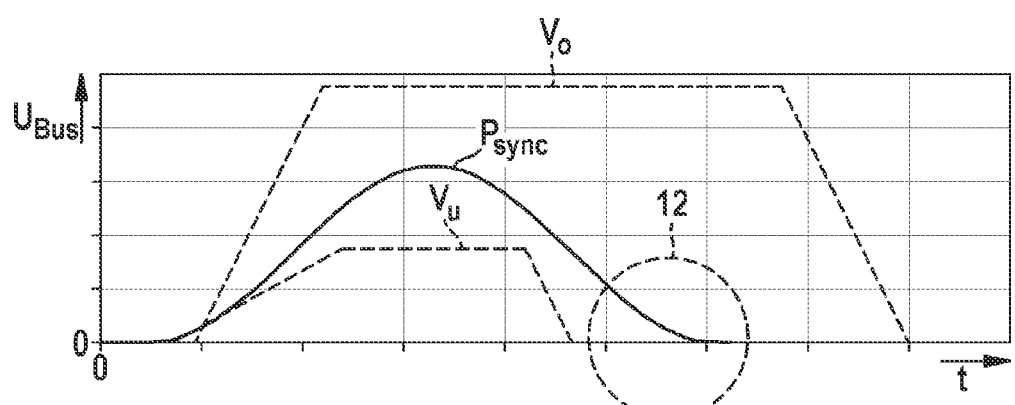
FIG. 2 schematically depicts the shape and the time-related behavior of a synchronization pulse, optimized according to the present invention, within the predefined limits.

As is evident from FIG. 2, voltage generator 30 generates the synchronization pulse $P_{sync}$ within predefined specification limits Vo, Vu with a predefined shape and a predefined time-related behavior. Receiving assemblage 3 outputs synchronization pulse $P_{sync}$ via data bus 5 to the at least one sensor 7 for synchronization of a subsequent signal transfer. In order for a synchronous bus system to function with one sensor 7 or with multiple sensors, the synchronization pulse $P_{sync}$ that is depicted exhibits a specific shape and a specific time-related behavior for all possible bus configurations and under all possible operating conditions. As is further evident from FIG. 2, the synchronization pulse $P_{sync}$ has an edge slope that is predefined by the edge slope of a first characteristic curve which represents the lower limit Vu, and the edge slope of a second characteristic curve which represents the upper limit Vo. As a result of the sinusoidal or sinusoidal-like shape, the synchronization pulse $P_{sync}$ is optimized within the predefined limits Vu, Vo in such a way that the lowest possible electromagnetic emission can be achieved in particular in the signal transfer spectral range (100 kHz to 300 kHz), said emission remaining confined to the fundamental wave region of the synchronization pulse $P_{sync}$.

As is further evident from FIG. 1, the exemplifying embodiment depicted of receiving assemblage 3 according to the present invention encompasses voltage generator 30, which encompasses a shared digital control application circuit 32 and a shared digital/analog converter 34, which generate a substantially sinusoidal reference current and output it to current source 3.5 and to current sink 3.6. The number of components of voltage generator 30 can be reduced thanks to the shared use of digital control application circuit 32 and of digital/analog converter 34 for current source 3.5 and current sink 3.6. Voltage generator 30 thereby economizes on layout area or silicon area. The exemplifying embodiment depicted enables a very robust implementation of the synchronization pulse $P_{sync}$ and a reduced electromagnetic emission. Control application to current source 3.5 and to current sink 3.6 for generation of the synchronization pulse $P_{sync}$ can moreover be displaced entirely into the digital section of receiving assemblage 3, which results in an area-efficient solution given the constant scaling progress of semiconductor technology.

As is further evident from FIG. 1, a voltage supply 3.2 to the remaining circuits 3.3 of receiving assemblage 3 is decoupled from data bus 5 via a switching unit 3.4 during generation and output of the synchronization pulse $P_{sync}$, while voltage generator 30 is activated in order to generate the synchronization pulse $P_{sync}$. Because voltage generator 30 encompasses current source 3.5 and current sink 3.6, the need for an additional switch in series with current source 3.5 and current sink 3.6 is eliminated.

The shape of the synchronization pulse $P_{sync}$ either is stored in the digital section or in digital control application circuit 32, or is calculated in digital control application circuit 32 with the aid of an algorithm. At least one digital/analog converter 34 generates, from an N-bit data word, a reference current that is conveyed via current source 3.5 or current sink 3.6 onto the data bus and respectively charges or discharges the load present on the data bus. In order to generate a sinusoidal or approximately sinusoidal synchronization pulse $P_{sync}$ shown in FIG. 2, sinusoidal or substantially sinusoidal control is applied both to current source 3.5 and to current sink 3.6.

As is further evident from FIG. 2, requirements are imposed on the shape and the edge slope of the synchronization pulse $P_{sync}$. On the one hand, the edge slope must not be too shallow, since this results in higher tolerances for the detection time of sensors 7. This in turn can limit the maximum number of sensors 7 and thus reduce data throughput. On the other hand, the edge slope must not be too steep because this leads to intensified electromagnetic emission. Two variables that greatly influence the behavior of the synchronization pulse $P_{sync}$ are the bus load and the quiescent current of sensor 7 or of the sensors. Different bus and sensor configurations exhibit greatly different loads and quiescent currents. A regulation of the bus current $I_{Bus}$ or bus voltage $U_{Bus}$ is carried out so that a synchronization pulse $P_{sync}$ can be prepared within the predefined limits Vu, Vo despite these large variations in bus load and quiescent current.

Digital control application circuit 32 uses the information regarding the quiescent current $I_0$ from a quiescent current regulator 10 of residual receiver circuit 3.3, and information regarding the maximum synchronization pulse amplitude reached, to regulate the synchronization pulse $P_{sync}$. The knowledge of the quiescent current is used to ensure correct acquisition of the quiescent current, at the start of the synchronization pulse $P_{sync}$, by current source 3.5 and current sink 3.6 of synchronization pulse generator 30. "Synchronization pulse generator" refers to voltage generator 30, which generates the synchronization pulse $P_{sync}$ and encompasses the at least one digital control application element 32, the at least one digital/analog converter 34, current source 3.5, current sink 3.6, and voltage supply 3.1 for current source 3.5. The maximum synchronization pulse amplitude is ascertained by evaluating the bus voltage $U_{Bus}$. A decision threshold and a time window can be defined, for example, for evaluation of the bus voltage $U_{Bus}$. Evaluation of the bus voltage $U_{Bus}$, and a corresponding regulating action, ensure the desired shape of the synchronization pulse $P_{sync}$ between the starting point and end point of the synchronization pulse $P_{sync}$. The regulating action does not ensure, however, that the bus voltage $U_{Bus}$ to which the synchronization pulse $P_{sync}$ is set is correctly acquired by voltage generator 30 that generates the synchronization pulse $P_{sync}$. For this, embodiments of the present invention use evidence regarding the quiescent voltage or quiescent current on bus 5, as well as a regulating action that minimizes the inaccuracies in the sensing of the quiescent voltage or quiescent current and in the subsequent application of control to the charging and discharging current sources or to current source 3.5 and current sink 3.6 of voltage generator 30.

Automatic regulation of the quiescent current, which is present-day existing art, provides an indication of the quiescent current. This information is used by voltage generator 30 to generate the synchronization pulse $P_{sync}$ in order to correctly acquire the quiescent current with the charging or discharging current sources or current source 3.5 and current sink 3.6. The information regarding the present quiescent current is furnished by quiescent current regulator 10, which is disposed in the "remaining receiver circuit 3.3" block. Because voltage generator 30 for generating the synchronization pulse $P_{sync}$, and quiescent current regulator 10, are mutually independent, the current sensed by quiescent current regulator 10 can differ from the current generated by voltage generator 30. This situation is depicted in the subsequent illustrations.

Figure 3:
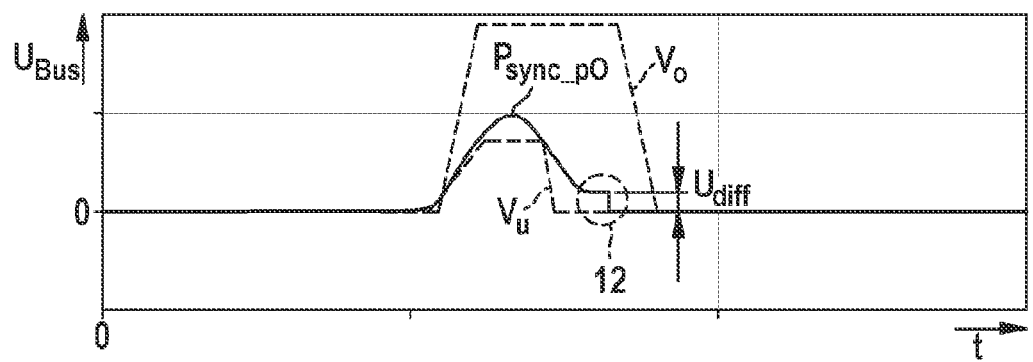
FIG. 3 schematically depicts the change in bus voltage during a synchronization pulse in the context of a synchronization current that is greater than a quiescent current.
Figure 4:
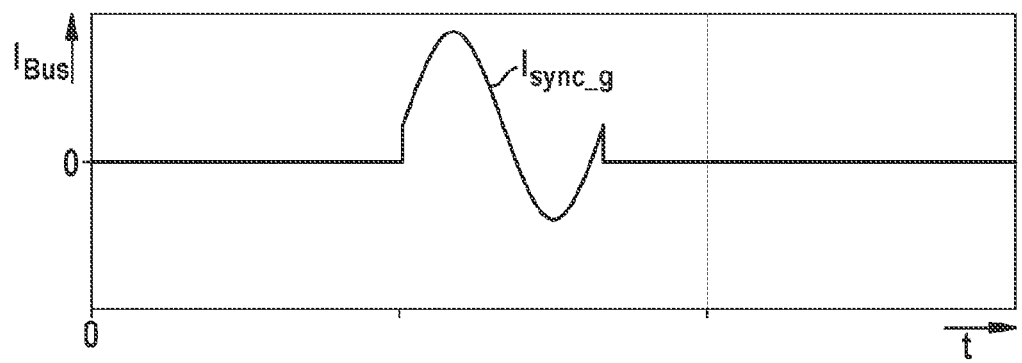
FIG. 4 schematically depicts the change in bus current during the synchronization pulse of FIG. 3.

FIG. 3 shows the change in the bus voltage $U_{Bus}$ of the synchronization pulse $P_{sync\_}{}^{pO}$, and FIG. 4 the corresponding change in the bus current $I_{Bus}$, when the synchronization current $I_{sync\_}{}^{g}$ is greater than the quiescent current at the time of acquisition. Because the charging current $I_{sync\_}{}^{g}$ from voltage generator 30 is greater than the quiescent current, the synchronization pulse $P_{sync\_}{}^{pO}$ ends at a higher value than the quiescent voltage, so that the synchronization pulse $P_{sync\_}{}^{pO}$ exhibits, at the end, a positive voltage difference $U_{diff}$ or a positive voltage offset.

Figure 5:
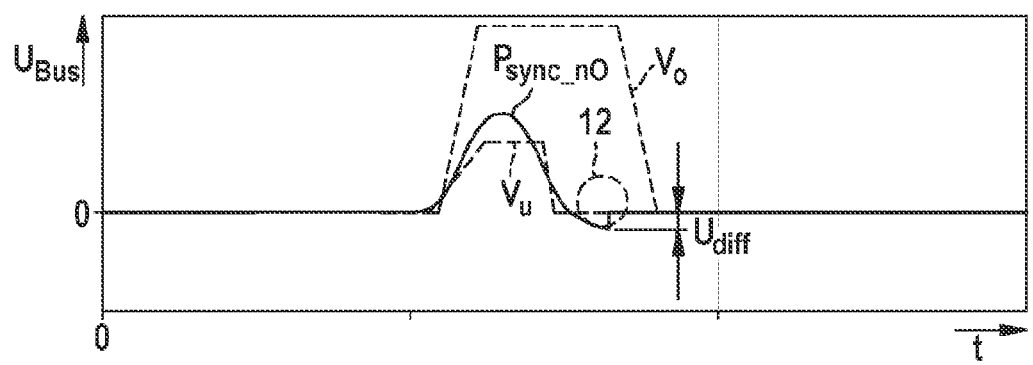
FIG. 5 schematically depicts the change in bus voltage during a synchronization pulse in the context of a synchronization current that is less than the quiescent current.
Figure 6:
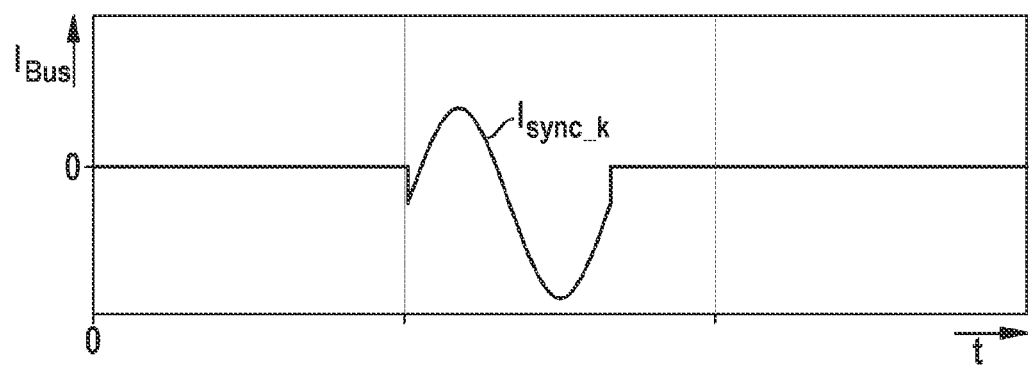
FIG. 6 schematically depicts the change in bus current during the synchronization pulse of FIG. 5.

FIG. 5 shows the change in the bus voltage $U_{Bus}$ of the synchronization pulse $P_{sync\_}{}^{nO}$, and FIG. 6 the corresponding change in the bus current $I_{Bus}$, when the synchronization current $I_{sync\_}{}^{k}$ is less than the quiescent current at the time of acquisition. Because the charging current $I_{sync\_}{}^{k}$ from voltage generator 30 is less than the quiescent current, the synchronization pulse $P_{sync\_}{}^{nO}$ ends at a lower value than the quiescent voltage, so that the synchronization pulse $P_{sync\_}{}^{nO}$ exhibits, at the end, a negative voltage difference $U_{diff}$ or a negative voltage offset.

Figure 7:
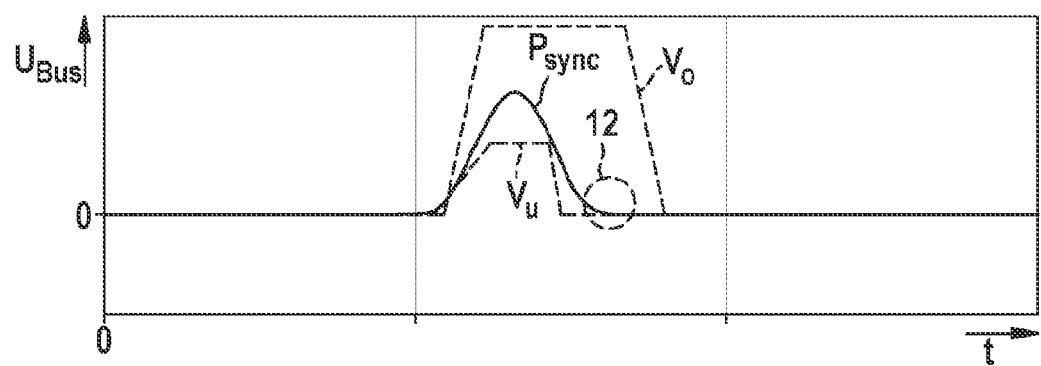
FIG. 7 schematically depicts the change in bus voltage during an optimized synchronization pulse in the context of a synchronization current that is equal to the quiescent current.
Figure 8:
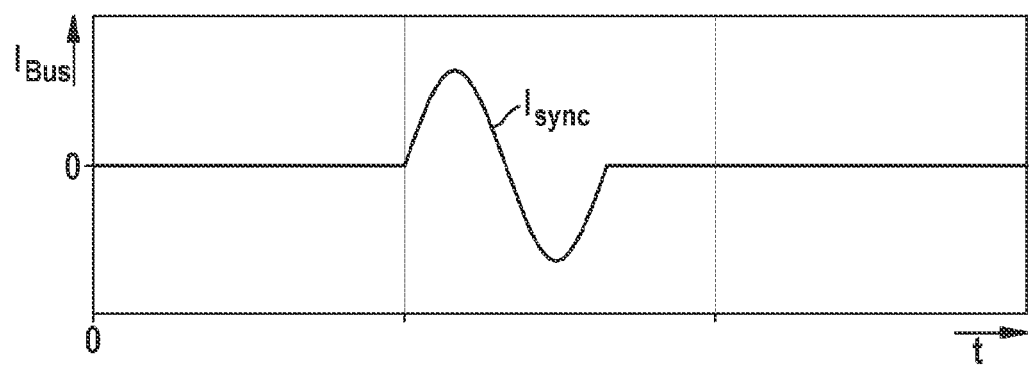
FIG. 8 schematically depicts the change in bus current during the synchronization pulse of FIG. 7.

In the depictions of FIGS. 7 and 8, the quiescent current has been correctly acquired from the charging and discharging sources or from current source 3.5 and current sink 3.6 of voltage generator 30, and both the current curve and the voltage curve of the synchronization pulse $P_{sync}$ are free of offsets.

In FIGS. 3 to 6, the synchronization pulse $P_{sync\_pO}$ or synchronization pulse $P_{sync\_nO}$ begins at a voltage that corresponds approximately to the quiescent voltage and as a rule does not exhibit any appreciable offset. The reason why this is observed is that the bus capacitance integrates the current $I_{Bus}$ on bus 5, and brief dips or rises in the current are represented in smoothed fashion in the voltage. The offset voltage is therefore most clearly apparent at the end 12 of the synchronization pulse $P_{sync}$. In order to make possible the situation in FIGS. 7 and 8, the pulse voltage is therefore monitored in the circled region, i.e. toward the end 12 of the synchronization pulse $P_{sync}$, and is continuously compared with the supply voltage for the receiver. If the pulse voltage differs from the supply voltage, the application of control to digital/analog converter 34 by digital control application circuit 32 of voltage generator 30 is correspondingly adapted.

Embodiments of the method according to the present invention for generating a synchronization pulse $P_{sync}$ for synchronizing a subsequent signal transfer between receiving assemblage 3 and at least one sensor 7 via a data bus 5 in a vehicle generate the synchronization pulse $P_{sync}$ within predefined specification limits Vo, Vu with a predefined shape and a predefined time-related behavior. At the beginning of the signal transfer between the at least one sensor 7 and receiver assemblage 3, the synchronization pulse $P_{sync}$ is transferred from receiver assemblage 3 to the at least one sensor 7. The synchronization pulse $P_{sync}$ is generated substantially as a sinusoidal oscillation. According to the present invention, a voltage value at the end 12 of the synchronization pulse $P_{sync}$ is compared with a corresponding voltage value of a supply voltage of a second voltage source 3.2 of residual receiver circuit 3.3 and a voltage difference $U_{diff}$ is ascertained, control being applied to current source 3.5 and to current sink 3.6 as a function of the ascertained voltage different $U_{diff}$ in such a way that the ascertained voltage difference $U_{diff}$ drops below a predefined threshold value.

What is claimed is:

1. A receiving assemblage for a control device in a vehicle, comprising:
   a voltage generator for generating a synchronization pulse, the voltage generator including:
      a first voltage source;
      a current source; and
      a current sink, wherein the voltage generator is configured to generate a synchronization pulse that has a shape defined by a rise and a fall over time of a value of a voltage of the synchronization pulse; and
   a data bus via which the receiving assemblage is configured to output the synchronization pulse to at least one sensor to synchronize transfer of signals from the at least one sensor to the receiving assemblage;
   wherein the voltage generator is configured to:
      generate the synchronization pulse by toggling between the current source charging the data bus and the current sink discharging the data bus
      compare the value of the voltage at an end of the synchronization pulse with a voltage value of a supply voltage of a second voltage source of a residual receiver circuit in order to ascertain a value of a voltage difference;

apply control to the current source and to the current sink as a function of the ascertained value of the voltage difference to thereby modify the voltage at the end of the synchronization pulse to a value by which the voltage difference drops to less than a predefined threshold value.

2. The receiving assemblage as recited in claim 1, wherein the voltage generator includes at least one digital control application circuit and at least one digital/analog converter, which generate a substantially sinusoidal reference current and output the substantially sinusoidal reference current to the current source and to the current sink.

3. The receiving assemblage as recited in claim 1, wherein the current source furnishes current values that are greater than or equal to 0 mA, and the current sink furnishes current values that are less than 0 mA.

4. The receiving assemblage as recited in claim 2, wherein the at least one digital control application circuit at least one of stores and calculates the shape of the synchronization pulse and, outputs corresponding digital data words to the at least one digital/analog converter.

5. The receiving assemblage as recited in claim 2, wherein the at least one digital control application circuit obtains an indication of a quiescent current of the at least one sensor and regulates the synchronization pulse based on the obtained indication of the quiescent current of the at least one sensor and on a voltage level of the data bus.

6. The receiving assemblage as recited in claim 5, wherein a quiescent current regulator of the residual receiver circuit supplies the indication of the quiescent current.

7. The receiving assemblage as recited in claim 2, wherein the at least one digital control application circuit regulates the synchronization pule based on a quiescent current of the at least one sensor and on a synchronization pulse amplitude that is ascertained by an evaluation of a voltage on the data bus.

8. A method comprising:

generating, by toggling charging of a data bus by a current source and discharging of the data bus by a current sink, a synchronization pulse that has a shape defined by a rise and a fall over time of a value of a voltage of the synchronization pulse;

transferring the synchronization pulse from a receiver assemblage to at least one sensor to synchronize transfer of signals from the at least one sensor to the receiver assemblage via the data bus;

comparing a value of a voltage at an end of the synchronization pulse with a voltage value of a supply voltage of a voltage source, thereby ascertaining a value of a voltage difference; and applying a control to the current source and to the current sink as a function of the ascertained value of the voltage difference to thereby modify the voltage at the end of the synchronization pulse to a value by which the voltage difference drops to less than a predefined threshold value.

* * * * *